United States Patent
Loth

(10) Patent No.: US 9,192,079 B2
(45) Date of Patent: Nov. 17, 2015

(54) POWER ELECTRONIC MODULE COOLING SYSTEM AND METHOD

(75) Inventor: Michael William Loth, Germantown, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 930 days.

(21) Appl. No.: 12/239,009

(22) Filed: Sep. 26, 2008

(65) Prior Publication Data

US 2010/0079944 A1 Apr. 1, 2010

(51) Int. Cl.
*H05K 7/20* (2006.01)

(52) U.S. Cl.
CPC ........ *H05K 7/20918* (2013.01); *H05K 7/20163* (2013.01)

(58) Field of Classification Search
CPC .......... H05K 7/20909; H05K 7/20918; H05K 7/20145; H05K 7/20154; H05K 7/20163; H01L 23/467
USPC .......................... 361/679.46–679.54, 688–723
See application file for complete search history.

(56) References Cited

U.S. PATENT DOCUMENTS

| | | | | |
|---|---|---|---|---|
| 4,459,638 A * | 7/1984 | Brehm et al. | | 361/697 |
| 4,520,425 A * | 5/1985 | Ito | | 361/697 |
| 4,872,102 A * | 10/1989 | Getter | | 363/141 |
| 5,091,823 A * | 2/1992 | Kanbara et al. | | 361/697 |
| 5,170,336 A * | 12/1992 | Getter et al. | | 363/141 |
| 5,497,289 A * | 3/1996 | Sugishima et al. | | 361/709 |
| 5,563,768 A * | 10/1996 | Perdue | | 361/695 |
| 5,610,493 A * | 3/1997 | Wieloch | | 318/801 |
| 5,623,191 A * | 4/1997 | Wieloch | | 318/801 |
| 5,631,821 A * | 5/1997 | Muso | | 363/141 |
| 5,742,478 A * | 4/1998 | Wu | | 361/704 |
| 5,774,353 A * | 6/1998 | Wieloch | | 363/146 |
| 5,930,112 A * | 7/1999 | Babinski et al. | | 361/695 |
| 6,027,535 A * | 2/2000 | Eberle et al. | | 361/690 |
| 6,046,908 A * | 4/2000 | Feng | | 361/707 |
| 6,081,425 A * | 6/2000 | Cheng | | 361/704 |
| 6,087,800 A * | 7/2000 | Becker et al. | | 318/778 |
| 6,320,776 B1 * | 11/2001 | Kajiura et al. | | 363/141 |
| 6,359,779 B1 * | 3/2002 | Frank et al. | | 361/679.47 |
| 6,418,015 B1 * | 7/2002 | Kociecki | | 361/695 |
| 6,466,441 B1 | 10/2002 | Suzuki | | |
| 6,493,227 B2 * | 12/2002 | Nielsen et al. | | 361/703 |
| 6,515,858 B2 | 2/2003 | Rodriguez et al. | | |
| 6,621,700 B1 * | 9/2003 | Roman et al. | | 361/697 |
| 6,665,183 B1 | 12/2003 | Shikata et al. | | |
| 6,678,157 B1 * | 1/2004 | Bestwick | | 361/695 |
| 6,826,035 B2 * | 11/2004 | Roman et al. | | 361/622 |
| 6,862,182 B1 * | 3/2005 | Roman et al. | | 361/697 |
| 6,891,725 B2 | 5/2005 | Derksen | | |
| 6,921,328 B1 * | 7/2005 | Nohara et al. | | 454/184 |
| 7,027,300 B2 | 4/2006 | Lord | | |

(Continued)

*Primary Examiner* — Zachary M Pape
(74) *Attorney, Agent, or Firm* — Fletcher Yoder, P.C.

(57) ABSTRACT

An improved cooling mechanism for a power electronics device is provided. More specifically, a cooling mechanism is provided that includes an air passageway configured to allow cooling air to bypass a portion of a heatsink adjacent to the rectifier circuitry and direct cooling air into an area of the heatsink that is nearer to the inverter circuitry. Another embodiment employs an air passageway with an air directing structure configured to provide an air flow that impinges on a lateral surface of the heatsink. In another embodiment, the air directing structure is chosen to provide a turbulent air flow in the heat dissipating structure within the vicinity of the inverter circuitry.

19 Claims, 5 Drawing Sheets

(56) References Cited

U.S. PATENT DOCUMENTS

| | | | |
|---|---|---|---|
| 7,042,745 B1* | 5/2006 | Chen | 363/144 |
| 7,054,157 B2 | 5/2006 | Hirota et al. | |
| 7,085,136 B2* | 8/2006 | Lin | 361/712 |
| 7,149,064 B2* | 12/2006 | Nolden et al. | 361/23 |
| 7,265,985 B2* | 9/2007 | Widmayer et al. | 361/721 |
| 7,515,422 B2* | 4/2009 | Hirota et al. | 361/709 |
| 7,554,804 B2* | 6/2009 | Kunkle | 361/695 |
| 7,729,115 B2* | 6/2010 | Hall et al. | 361/695 |
| 7,773,369 B2* | 8/2010 | Dornauer et al. | 361/676 |
| 7,813,128 B2* | 10/2010 | Marchand | 361/694 |
| 7,817,421 B2* | 10/2010 | Nagatomo et al. | 361/697 |
| 7,898,806 B2* | 3/2011 | Isomoto | 361/697 |
| 8,379,384 B2* | 2/2013 | Smalen et al. | 361/679.51 |
| 8,797,738 B2* | 8/2014 | Nagano et al. | 361/690 |
| 8,837,119 B2* | 9/2014 | Kishimoto et al. | 361/678 |
| 8,854,807 B2* | 10/2014 | Hoffmann et al. | 361/679.5 |
| 2002/0036889 A1 | 3/2002 | Ruiz-Gomez et al. | |
| 2004/0109293 A1* | 6/2004 | Apfelbacher et al. | 361/709 |
| 2007/0159861 A1* | 7/2007 | Meier et al. | 363/63 |
| 2009/0268405 A1* | 10/2009 | Kaveh | 361/697 |
| 2014/0376184 A1* | 12/2014 | Gohara | 361/689 |

* cited by examiner

POWER ELECTRONIC MODULE COOLING SYSTEM AND METHOD

BACKGROUND

The invention relates generally to the field of power electronic devices such as those used in power conversion or for applying power to motors and other loads. More particularly, the invention relates to a power electronic module with an improved cooling arrangement which provides enhanced air flow characteristics and enhanced heat dissipation.

In the field of power electronic devices, a wide range of circuitry is known and currently available for converting, producing and applying power to loads. Depending upon the application, such circuitry may convert incoming power from one form to another as needed by the load. In a typical arrangement, for example, constant (or varying) frequency alternating current power (such as from a utility grid or generator) is converted to controlled frequency alternating current power to drive motors, and other loads. In this type of application, the frequency of the output power can be regulated to control the speed of the motor or other device. Many other applications exist, however, for power electronic circuits which can convert alternating current power to direct current power, or vice versa, or that otherwise manipulate, filter, or modify electric signals for powering a load. Circuits of this type generally include rectifiers (converters), inverters, and similar switched circuitry. For example, a motor drive will typically include a rectifier that converts AC power to DC. Often, power conditioning circuits, such as capacitors and/or inductors, are employed to remove unwanted voltage ripple on the internal DC bus. Inverter circuitry can then convert the DC signal into an AC signal of a particular frequency desired for driving a motor at a particular speed. The inverter circuitry typically includes several high power switches, such as insulated-gate bipolar transistors (IGBTs), controlled by drive circuitry.

The motor drive circuitry detailed above will typically generate substantial amounts of heat, which must be dissipated to avoid damaging heat sensitive electronics. Typically, therefore, some form of cooling mechanism is usually employed to enhance heat extraction and dissipation. Often, the motor drive circuitry is packaged together as a unit with a built-in cooling channel that carries cool air to several components. Because the air within the channel is heated as it travels through the channel, components near the exhaust end of the air channel will usually experience a diminished cooling effect. Therefore, as packaged control units become more compact, the need for efficient heat dissipation becomes more critical.

Additionally, as the workload or motor speed changes, the temperature of the inverter circuitry (e.g., the IGBTs) generally increases, causing higher failure rates and reduced reliability. The power output of the unit is often, therefore, limited by the maximum temperature that the inverter circuitry can handle without substantially increasing the risk of failure. A more effective cooling mechanism that provides additional cooling for the inverter circuitry would, therefore, allow the motor drive to operate at higher motor speeds.

Therefore, it may be advantageous to provide a motor drive with an improved cooling mechanism. In particular, it may be advantageous to provide a cooling mechanism that provides increased cooling for the inverter circuitry of a power electronic module such as a motor drive.

BRIEF DESCRIPTION

The present invention relates generally to a cooling configuration designed to address such needs. One embodiment employs an air passageway configured to allow cooling air to bypass a portion of a heatsink adjacent to the rectifier circuitry and direct cooling air into an area of the heatsink that is nearer to the inverter circuitry. Another embodiment employs an air passageway with an air directing structure configured to provide an air flow that impinges on a lateral surface of the heatsink. In another embodiment, the air directing structure is chosen to provide a turbulent air flow in the heat dissipating structure within the vicinity of the inverter circuitry.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
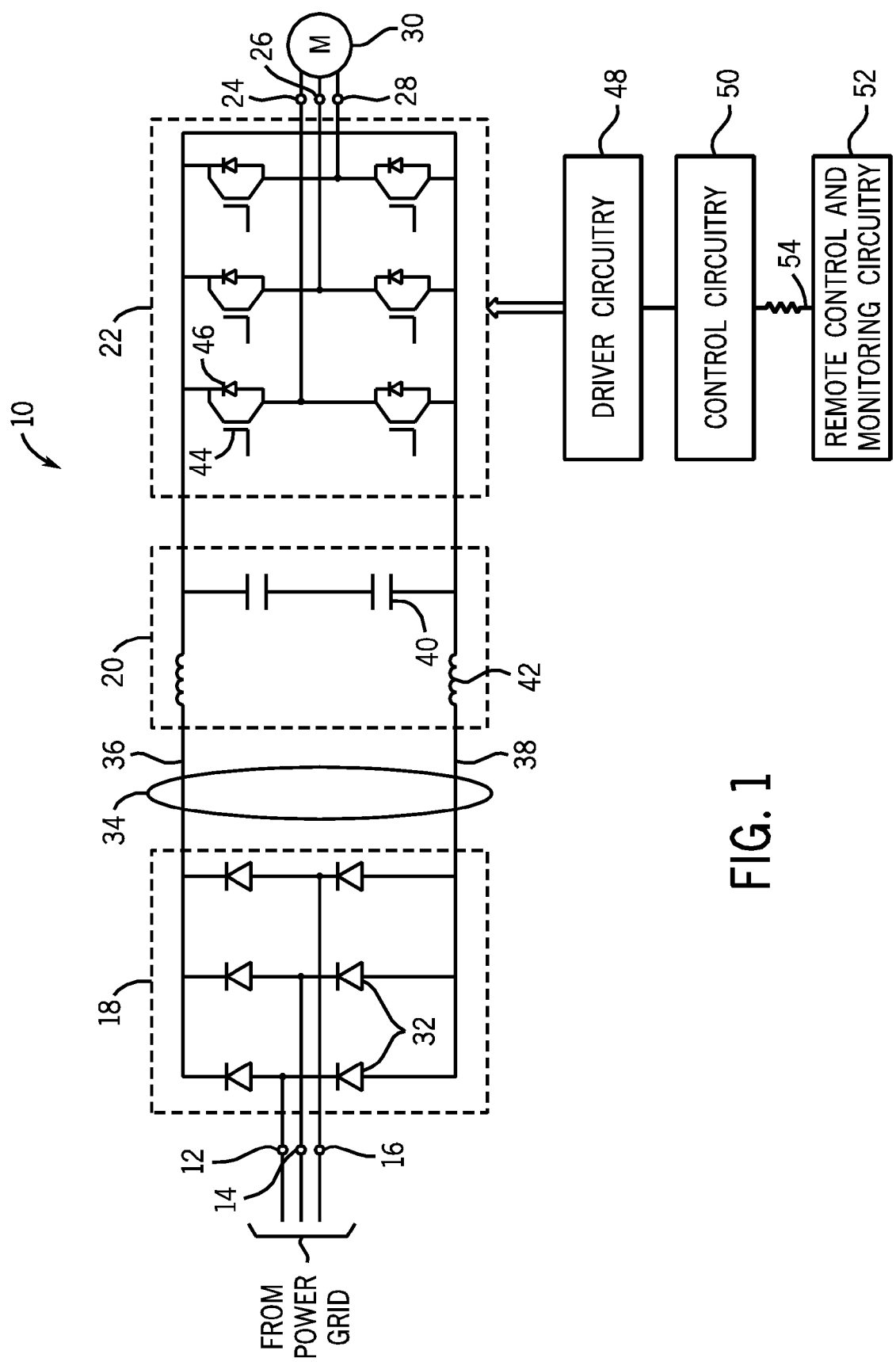
FIG. 1 is a diagrammatical representation of an exemplary motor drive circuit in accordance with one embodiment of the present invention.

FIG. 1 is a diagrammatical representation of an exemplary motor drive circuit 10 employing an air passageway with an air directing structure for providing enhanced cooling of the motor drive circuitry. The motor drive circuit 10 includes a three phase power source electrically coupled to a set of input terminals 12, 14 and 16 that provides three phase AC power of constant frequency to a rectifier circuitry 18. In the rectifier circuitry 18, a set of six silicon-controlled rectifiers (SCRs) 32 provide full wave rectification of the three phase voltage waveform. Each input terminal entering the rectifier circuitry 18 is coupled between two SCRs 32 arranged in series, anode to cathode, which span from the low side 38 of the DC bus 34 to the high side 36 of the DC bus 34. Inductors 42 are coupled to both the high and low sides of the DC bus 34 and act as a choke for smoothing the rectified DC voltage waveform. Capacitors 40 link the high side 36 of the DC bus 34 with the low side 38 of the DC bus 34 and are also configured to smooth the rectified DC voltage waveform. Together, the inductors and capacitors serve to remove most of the AC ripple presented by the rectifier circuitry 18 so that the DC bus 34 carries a waveform closely approximating a true DC voltage. It should be noted that the three-phase implementation described herein is not intended to be limiting, and the invention may be employed on single-phase circuitry, as well as on circuitry designed for applications other than motor drives.

An inverter 22 is coupled to the DC bus 34 and generates a three phase output waveform at a desired frequency for driving a motor 30 connected to the output terminals 24, 26 and 28. Within the inverter 22, two switches 44 are coupled in series, collector to emitter, between the high side 36 and low side 38 of the DC bus 34. Three of these switch pairs are then coupled in parallel to the DC bus 34, for a total of six switches 44. Each switch 44 is paired with a flyback diode 46 such that the collector is coupled to the anode and the emitter is coupled to the cathode. Each of the output terminals 24, 26 and 28 is coupled to one of the switch outputs between one of the pairs of switches 44. The driver circuitry 48 signals the switches 44 to rapidly close and open, resulting in a three phase waveform output across output terminals 24, 26 and 28. The driver circuitry 48 is controlled by the control circuitry 50, which responds to the remote control and monitoring circuitry 52 through the network 54.

As discussed above, many of the circuit components depicted in FIG. 1 will generate significant amounts of heat, which can lead to component failure due to overheating. Therefore, to increase the heat dissipating properties of motor control circuit 10, the motor control circuit 10 will usually be packaged within a unit that includes a cooling channel and a heatsink, as shown in FIG. 2

Figure 2:
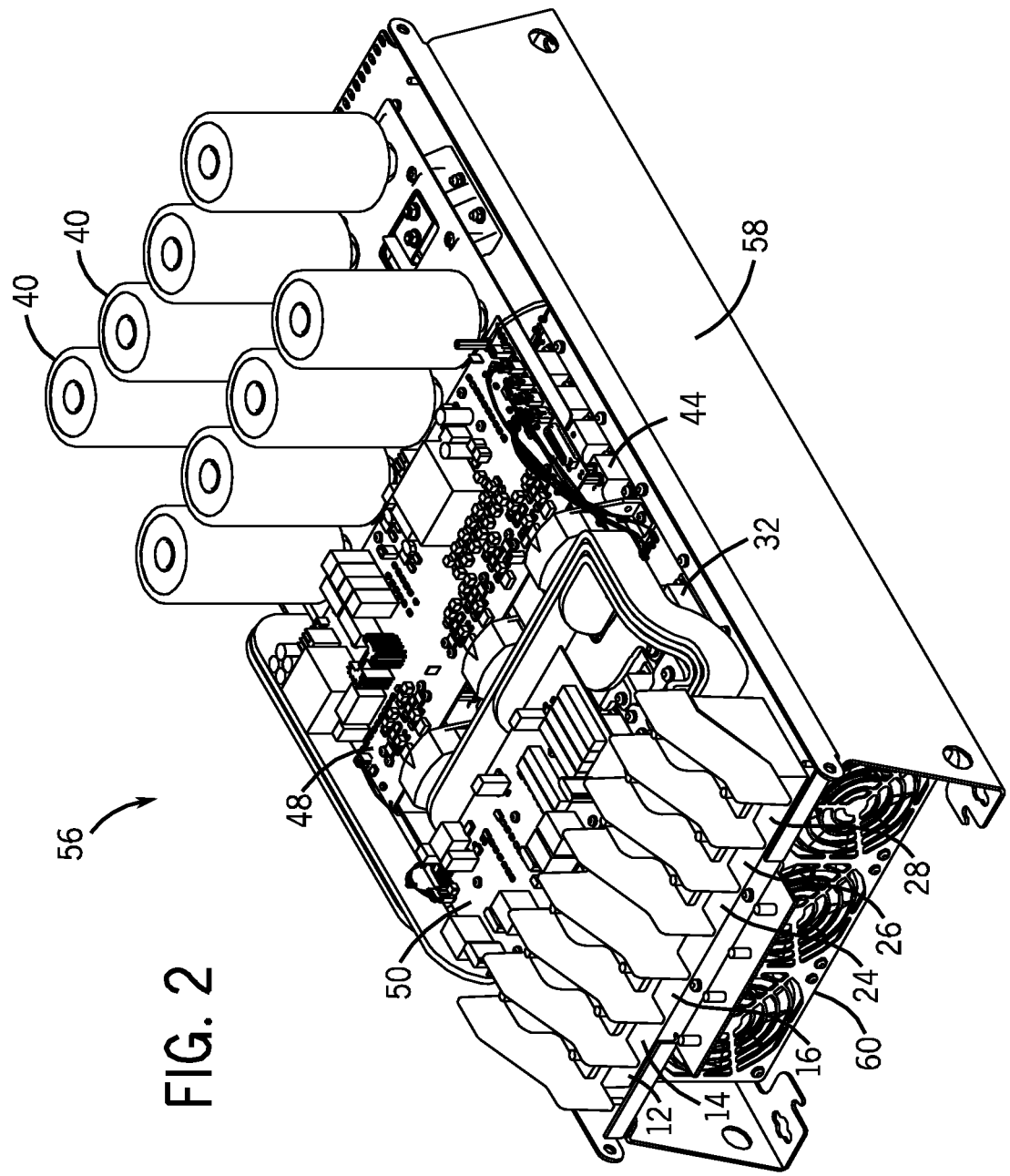
FIG. 2 is a perspective view of an exemplary motor drive unit in accordance with one embodiment of the present invention.

Turning now to FIG. 2, a perspective view of an exemplary motor drive unit in accordance with one embodiment of the present invention is shown. The motor drive unit 56 includes a cooling channel 58 enclosed by side plates. The motor drive unit 56 also includes a set of fans 60 to provide a flow of cooling air through the cooling channel 58. The SCRs 32, IGBTs 44, driver circuitry 48, and the control circuitry 50 are situated above and adjacent to the cooling channel 58 so that the flow of cool air draws heat from the circuitry. To make efficient use of the space within the motor drive unit 56, the SCRs 32 will generally be grouped together with the control circuitry 50 near the input of the cooling channel 58, and the IGBTs 44 will generally be grouped together with the driver circuitry 48 further downstream, i.e. toward the exhaust end of the cooling channel 58. It will be appreciated that, given a typical cooling channel arrangement, the downstream circuitry, such as the IGBTs 44, will experience diminished cooling compared to the upstream components. Embodiments of the present invention, however, provide improved cooling techniques that allow the cooling effects of the cooling air to be shifted downstream, toward the IGBT circuitry, as will be explained below in respect to FIGS. 3-5.

Figure 3:
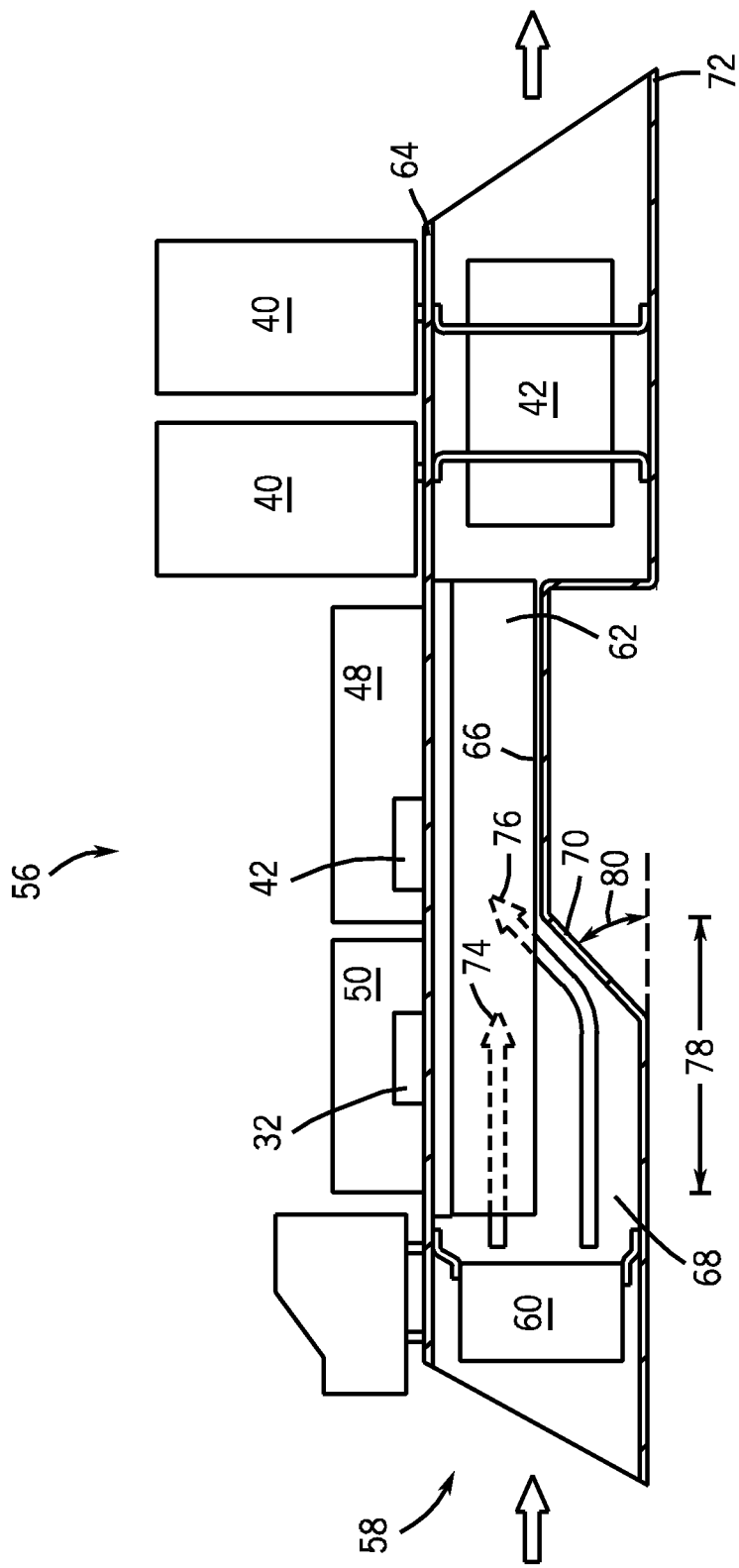
FIGS. 3-5 are cross sectional views of the motor drive unit shown in FIG. 2, illustrating exemplary air passageways with exemplary air directing structures.

FIG. 3 is a cross-sectional view of the control unit 56, and provides a better view of cooling channel 58. As can be seen in FIG. 3, the cooling channel 58 includes a heatsink 62 mounted below a lower plate 64 adjacent to the SCRs 32, the IGBTs 44, the driver circuitry 48, and the control circuitry 50. The heatsink 62 may include a series of parallel fins oriented toward the fans 60 to allow cooling air from the fans 60 to pass between the fins. Cooling air may also pass between the fins at a lateral face 66 of the heatsink 62. Also inside the cooling channel 58 is an open passageway 68 located adjacent to the heatsink 62 and extending some portion of the length of the heatsink 62. The open passageway 68 allows some portion of the air entering the cooling channel 58 to bypass the heatsink 62 for a certain distance. The cooling channel 58 also includes an air directing structure 70 positioned below the heatsink 62 and configured to direct air into a lateral face 66 of the heatsink 62. The air directing structure 70 may be formed by the bottom plate 72 of the cooling channel 58 as shown in FIG. 3, or alternatively, the air directing structure 70 may be a separate baffle located inside the cooling channel 58. As explained below, the cooling channel 58 provides improved cooling properties over the prior art by shifting a portion of the cooling air to a downstream location and by imparting an angular direction to the air flow.

In embodiments of the present invention, cooling air is forced by the fans 60 into the cooling channel 58, at which point, some of the air enters the leading edge of the heatsink 62, as illustrated by arrow 74, while some portion of the air enters the open passageway 68. The air entering the leading edge of the heatsink 62 will be warmed by the control circuitry 50 and the SCRs 32. However, because the open passageway 68 is not significantly thermally coupled to the heatsink 62, the air passing through the open passageway 68 will be relatively cool. Air entering the open passageway 68 is later forced up into the heatsink 62 by the air directing structure 70 at a location downstream from the control circuitry 50 and the SCRs 32, as illustrated by arrow 76. By directing cooler air into the heatsink 62 at the downstream location, rather than guiding all of the cooling air into the leading edge of the heatsink, the combined temperature of the cooling air adjacent to the driver circuitry 48 and the IGBTs 42 may be reduced, making those components relatively cooler. At the same time, however, the flow of cooling air adjacent to the control circuitry 50 and the SCRs 32 will be reduced, making those components relatively warmer. It can be seen, therefore, that using the techniques described above, the cooling influence of the air flow in the channel 58 may be shifted from an upstream location to a downstream location. In this way, the cooling air may be directed to circuitry that may have a greater need for cooling, such as the IGBTs 42, for example.

The degree of air flow shifting will depend on the setback 78 of the air directing structure 70. For purposes of the present description, the setback 78 is defined at the distance from the leading edge of the heatsink 62 to the point at which the air directing structure 70 meets the heatsink 62, as shown in FIG. 3. In some embodiments, the setback 78 of the air directing structure 70 may be selected to coincide with the leading edge of the IGBTs 42, so as to favor increased cooling for the IGBTs 42, as shown in FIG. 3. In other embodiments, the setback 78 may be increased or decreased to change the distribution of cooling air, and thereby favor certain components or spread the heat dissipation more evenly. In various embodiments, the setback 78 may range from ten percent to ninety percent of the length of the heatsink 62, as shown in FIGS. 4 and 5.

In addition to shifting the cooling air downstream, the air directing baffle 70 may also impart a directional component to the air that is perpendicular to the face of the heatsink, causing an angular airflow relative to the face of the heatsink. This angular, or impingent, air flow may tend to force cooler air deeper into the heatsink, closer to the heat source, while forcing warmed air out toward the exhaust of the heatsink. In this way, the rate of heat transfer from the heatsink 62 to the cooling air may be increased.

The angularity of the air flow depends, at least in part, on the angle 80 of the air directing structure 70. Furthermore, the angle selection may also affect the overall air flow resistance of the channel. In some embodiments, the angle 80 may be approximately forty-five degrees, as shown in FIG. 3. By orienting the air directing structure 70 to form an angle 80 of forty-five degrees a substantial level of angularity may be imparted to the air flow while, at the same time, maintaining a relatively low overall air flow resistance. In other embodiments, the angularity of the air flow and the air flow resistance may be increased or decreased by changing the angle 80 as shown in FIGS. 4 and 5, which are described below. In various embodiments, the angle 80 may range from 10 to 170 degrees.

Figure 4:
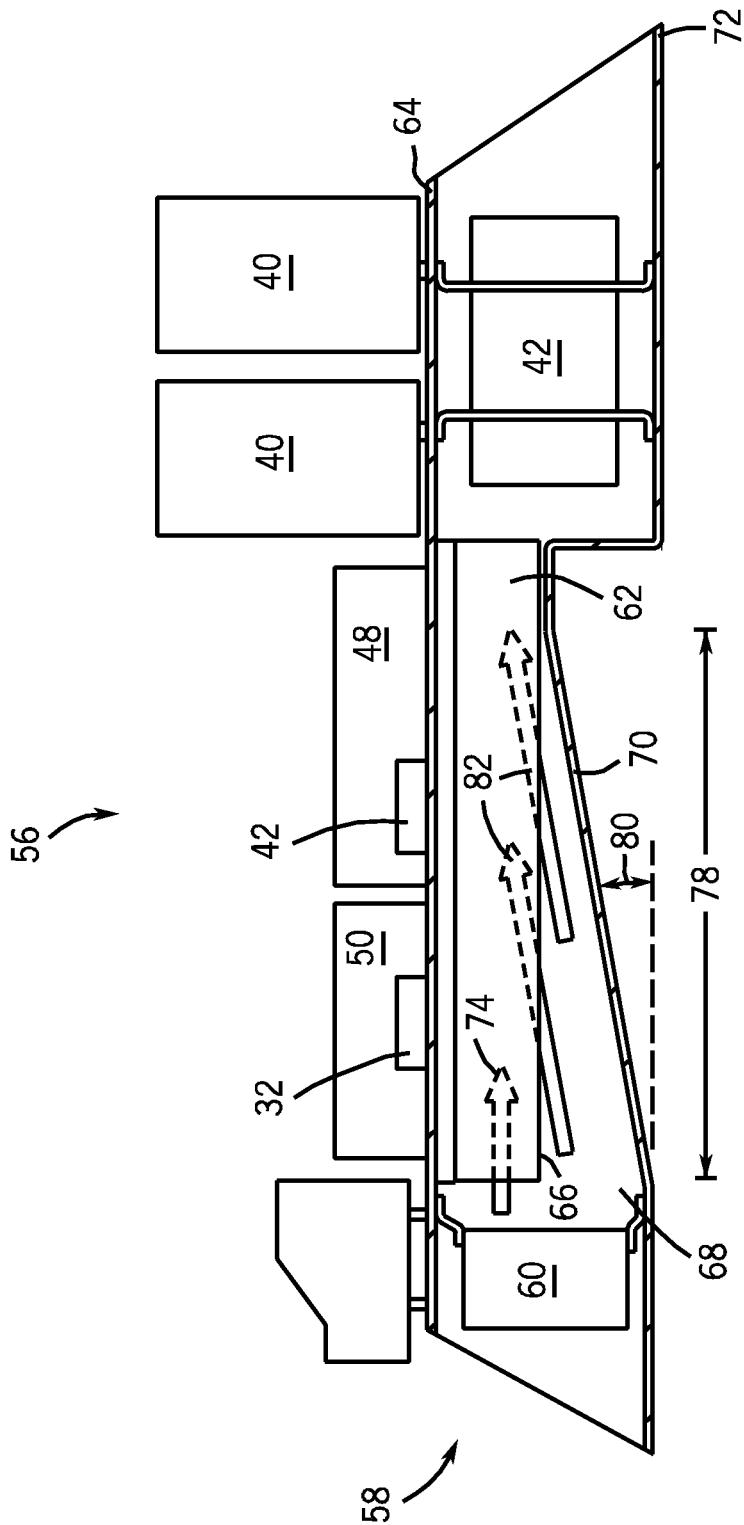
Figure 5:
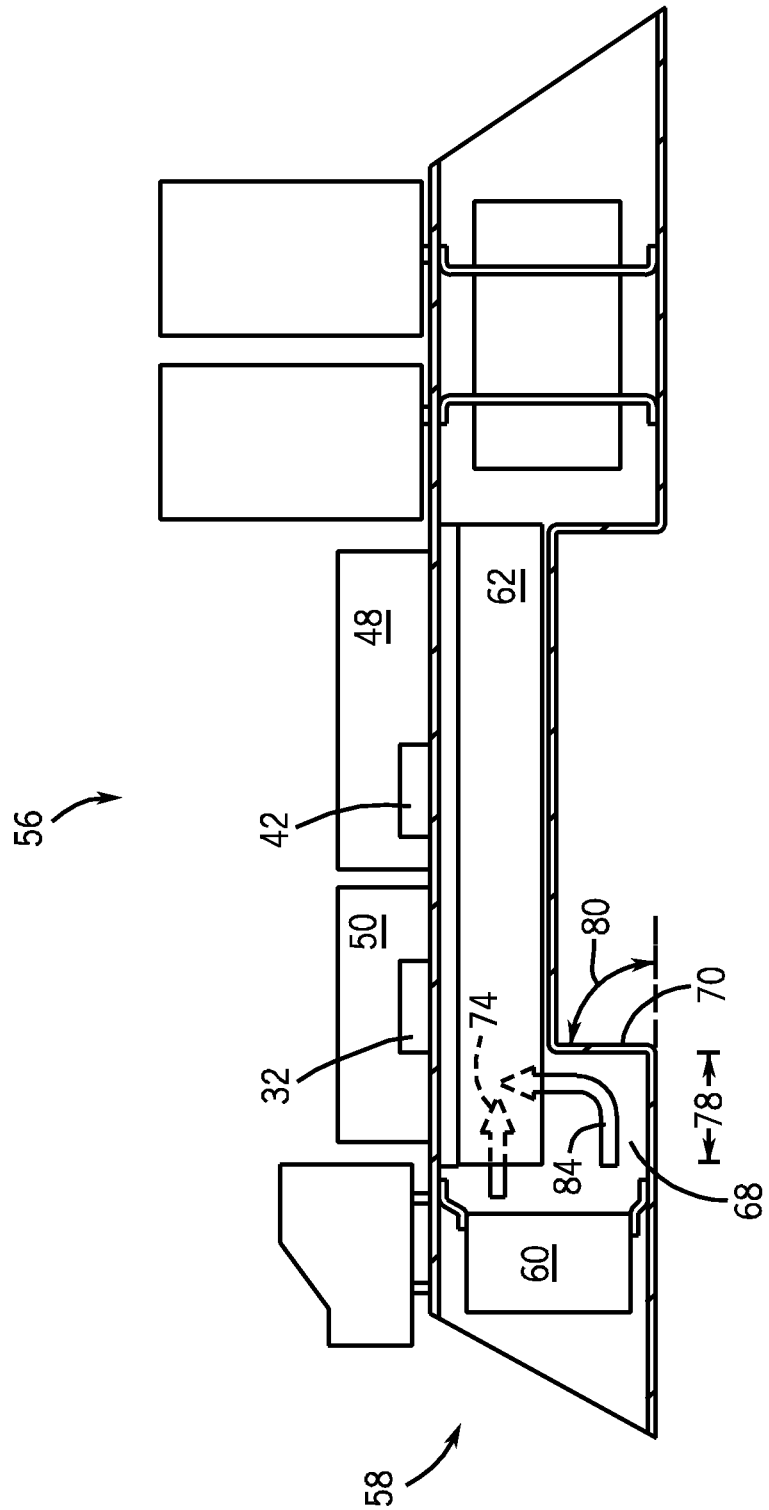

Turning now to FIGS. 4 and 5, additional embodiments of a motor drive unit with exemplary cooling channels are shown. Turning specifically to FIG. 4, an embodiment is shown in which the angle 80 of the air directing structure 70 is approximately ten degrees and the setback distance 78 is approximately ninety percent of the length of the heatsink 62. In this embodiment, the air in open passageway 68 is guided into the heatsink 62 more gradually compared to the embodiment of FIG. 3. The relatively large setback may tend to shift cooling air further downstream, providing enhanced cooling to downstream components. The relatively small angle reduces the angularity of the cooling air flowing through the heatsink 62. The large setback, in combination with the small angle tends to cause cooling air to be gradually guided into the heatsink 62 along a large portion of the lateral face 68 of the heatsink 62, as indicated by the arrows 82. In this way, the cooling effects of the cooling air may be more evenly distributed between the upstream and downstream components. Additionally, the small angle 80 may also decrease the overall airflow resistance of the cooling channel 58.

Turning to FIG. 5 an embodiment is shown in which the angle 80 of the air directing structure 70 is approximately ninety degrees and the setback distance 78 is approximately ten percent of the length of the heatsink 62. In this embodiment, the air in open passageway 68 is guided into the heatsink 62 more abruptly compared to the embodiment of FIG. 3. The ninety degree angle of the directing structure 70 increases the angularity of the cooling air flowing through the heatsink 62 in the vicinity of the upstream components, as indicated by the arrow 84. Additionally, the relatively short setback distance will tend to allow very little downstream shifting of cooling air, providing additional cooling air to components further upstream. The small setback, in combination with the ninety degree angle, may tend to focus cooling effects of the cooling air on the upstream components, causing more heat to be extracted from the upstream components, such as the SCRs. However, the ninety degree angle may also tend to increase the overall airflow resistance of the cooling channel 58.

It will be appreciated that a wide range of angles and setback distances may be utilized in various embodiments besides those depicted above. For example, to achieve a higher degree of cooling in the vicinity of the IGBTs an embodiment may include a setback distance of approximately 60 percent and an angle of approximately ninety degrees, thereby creating an air flow under the IGBTs with a high degree of angularity. For another example, the angle 80 of the air directing structure may be up to 170 degrees, in which case the air directing structure may form a pocket of air that the cooling air travels past before being directed into the heatsink.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor drive comprising:
   rectifier circuitry configured to be coupled to an AC power source and to provide power to a DC bus;
   inverter circuitry coupled to the DC bus and configured to generate drive signals for driving a motor;
   a fan for directing a flow of cooling air through an air passageway defined by a first wall and a second wall disposed adjacent to the rectifier circuitry and the inverter circuitry;
   a heat dissipating structure disposed between the first and second walls defining the air passageway and thermally coupled to the rectifier circuitry and to the inverter circuitry and cooled by a first portion of the flow of cooling air from the fan; and
   a substantially open space disposed in the air passageway adjacent to the heat dissipating structure and configured to allow a second portion of the flow of cooling air to bypass an upstream portion of the heat dissipating structure;
   wherein the first wall comprises an air directing structure disposed at an end of the substantially open space and configured to direct the second portion of the flow of cooling air from the substantially open space into a downstream portion of the heat dissipating structure to combine with the first portion of the flow of cooling air in the downstream portion of the heat dissipating structure, wherein the second portion of the flow of cooling air does not contact any circuitry of the motor drive before the second portion of the flow of cooling air combines with the first portion of the flow of cooling air in the downstream portion of the heat dissipating structure.

2. The motor drive of claim 1, wherein the rectifier circuitry is disposed adjacent to the second wall at the upstream portion of the heat dissipating structure.

3. The motor drive of claim 1, wherein the inverter circuitry is disposed adjacent to the second wall at the downstream portion of the heat dissipating structure.

4. The motor drive of claim 1, wherein the air directing structure comprises a solid barrier spanning the width of the air passageway.

5. The motor drive of claim 1, wherein the air directing structure is oriented at approximately a forty-five degree angle to the direction of the incoming air flow provided by the fan.

6. The motor drive of claim 1, wherein the air directing structure is oriented at approximately a ninety degree angle to the direction of the incoming air flow provided by the fan.

7. The motor drive of claim 1, wherein the air directing structure is configured to provide an impingent flow of cooling air to a portion of the heat dissipating structure that is adjacent to the inverter circuitry.

8. The motor drive of claim 1, wherein the air directing structure is configured to provide air turbulence in at least a portion of the heat dissipating structure that is adjacent to the inverter circuitry.

9. The motor drive of claim 1, wherein the substantially open space is defined by the first wall, a lateral surface of the heat dissipating structure, and the air directing structure.

10. A motor drive comprising:
    rectifier circuitry configured to be coupled to an AC power source and to provide power to a DC bus;
    inverter circuitry coupled to the DC bus and configured to generate drive signals for driving a motor;
    a fan for directing a flow of cooling air through an air passageway defined by a first wall and a second wall disposed adjacent to the rectifier circuitry and the inverter circuitry; and
    a heat dissipating structure disposed between the first and second walls defining the air passageway and thermally coupled to the rectifier circuitry and to the inverter circuitry and cooled by a first portion of the flow of cooling air from the fan flowing across a leading edge of the heat dissipating structure;
    wherein the first wall comprises an air directing structure with a setback distance and an angle, the air directing structure directing a second portion of the flow of cooling air into a lateral surface of the heat dissipating structure to combine with the first portion of the flow of cooling air, wherein the second portion of the flow of cooling air bypasses the leading edge of the heat dissipating structure and does not contact any circuitry of the motor drive before the second portion of the flow of cooling air is directed into the lateral surface of the heat dissipating structure.

11. The motor drive of claim 10, wherein the setback distance of the air directing structure is approximately ten percent to ninety percent of the length of the heat dissipating structure.

12. The motor drive of claim 10, wherein the setback distance of the air directing structure is approximately 30 to 70 percent of the length of the heat dissipating structure.

13. The motor drive of claim 10, wherein the angle of the air directing structure is approximately ten to ninety degrees.

14. The motor drive of claim 10, wherein the angle of the air directing structure is approximately thirty to sixty degrees.

15. The motor drive of claim 10, wherein the air directing structure directs an at least partially impingent air flow into the heat dissipating structure.

16. A method of cooling a motor drive unit, comprising:
   forcing cooling air into a cooling channel comprising a heat sink and a substantially open space adjacent to the heat sink;
   forcing a first portion of the cooling air into a leading edge of the heat sink;
   forcing a second portion of the cooling air into the substantially open space adjacent to the heat sink, wherein the second portion of cooling air bypasses the leading edge of the heat sink; and
   forcing the second portion of the cooling air into a lateral surface of the heatsink at a location downstream from the leading edge of the heatsink to combine with the first portion of the cooling air, wherein the second portion of the cooling air does not contact any circuitry of the motor drive unit before the second portion of the cooling air is forced into the lateral surface of the heatsink.

17. The method of claim 16, wherein the second portion of the cooling air is forced into the lateral surface of the heatsink by an air deflecting surface disposed generally opposite the heatsink.

18. A method for making a motor drive comprising:
   disposing a heatsink adjacent to a power electronic circuit in an enclosure, the heatsink extending into an open space forming a passageway for cooling air;
   disposing a fan at an end of the enclosure to blow cooling air into the passageway such that a first portion of the cooling air enters the heatsink at a forward edge of the heatsink and a second portion of the cooling air bypasses the forward edge of the heatsink;
   closing the open space with an enclosure wall that is spaced from the heatsink to form the open space, and that includes a cooling air deflecting surface positioned to direct the second portion of the cooling air from the passageway into contact with the heatsink at a location spaced from the forward edge of the heatsink, wherein the second portion of the cooling air does not contact any circuitry of the motor drive before the second portion of the cooling air is directed into the heatsink.

19. The method of claim 18, wherein the cooling air deflecting surface is an inclined portion of the enclosure wall that forms an angle of between approximately forty five and ninety degrees with respect to an upstream portion of the enclosure wall.

* * * * *